United States Patent
Chen

(10) Patent No.: US 10,777,717 B1
(45) Date of Patent: Sep. 15, 2020

(54) PIXEL ENCAPSULATING STRUCTURE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/358,717

(22) Filed: Mar. 20, 2019

(51) Int. Cl.
| | |
|---|---|
| *H01L 33/00* | (2010.01) |
| *H01L 21/00* | (2006.01) |
| *H01L 33/60* | (2010.01) |
| *H01L 21/66* | (2006.01) |
| *H01L 27/32* | (2006.01) |

(52) U.S. Cl.
CPC .............. *H01L 33/60* (2013.01); *H01L 22/12* (2013.01); *H01L 27/3211* (2013.01); *H01L 27/3244* (2013.01)

(58) Field of Classification Search
CPC ....... H01L 22/12; H01L 27/3211; H01L 33/60
USPC ............. 438/25–29, 35; 257/88, 98
See application file for complete search history.

(56) References Cited

U.S. PATENT DOCUMENTS

| | | | | |
|---|---|---|---|---|
| 7,768,196 B2 * | 8/2010 | Kobayashi | .......... | H01L 51/5265 313/504 |
| 7,868,528 B2 * | 1/2011 | Kobayashi | .......... | H01L 51/5281 313/112 |
| 10,461,278 B2 * | 10/2019 | Fukuda | .............. | H01L 51/5265 257/89 |

FOREIGN PATENT DOCUMENTS

JP     2005-100946    *   7/2004       H01L 51/5265

* cited by examiner

*Primary Examiner* — Calvin Lee
(74) *Attorney, Agent, or Firm* — CKC & Partners Co., LLC

(57) ABSTRACT

A pixel encapsulating structure including a substrate, three light-emitting devices, a filling material, and a first encapsulation layer is provided. The three light-emitting devices are present on the substrate. Two of the three light-emitting devices have different emission wavelengths. The filling material is present on the substrate and the three light-emitting devices. The first encapsulation layer is present on the filling material and covers the three light-emitting devices. One of the first encapsulation layer and the filling material has three portions respectively covering the three light-emitting devices, and two of the three portions have different refractive indices.

6 Claims, 6 Drawing Sheets

PIXEL ENCAPSULATING STRUCTURE

BACKGROUND

Field of Invention

The present disclosure relates to a pixel encapsulating structure for encapsulating a light-emitting device.

Description of Related Art

The statements in this section merely provide background information related to the present disclosure and do not necessarily constitute prior art.

In recent years, micro devices have become popular in various applications. One of the important subfields is micro light-emitting devices. Among all technical aspects of micro light-emitting devices, color shift viewed by a user in different angles with respect to a normal direction of a display is an important and long-standing issue.

SUMMARY

According to some embodiments of the present disclosure, a pixel encapsulating structure including a substrate, three light-emitting devices, a filling material, and a first encapsulation layer is provided. The three light-emitting devices are present on the substrate. Two of the three light-emitting devices have different emission wavelengths. The filling material is present on the substrate and the three light-emitting devices. The first encapsulation layer is present on the filling material and covers the three light-emitting devices. One of the first encapsulation layer and the filling material has three portions respectively covering the three light-emitting devices, and two of the three portions have different refractive indices.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
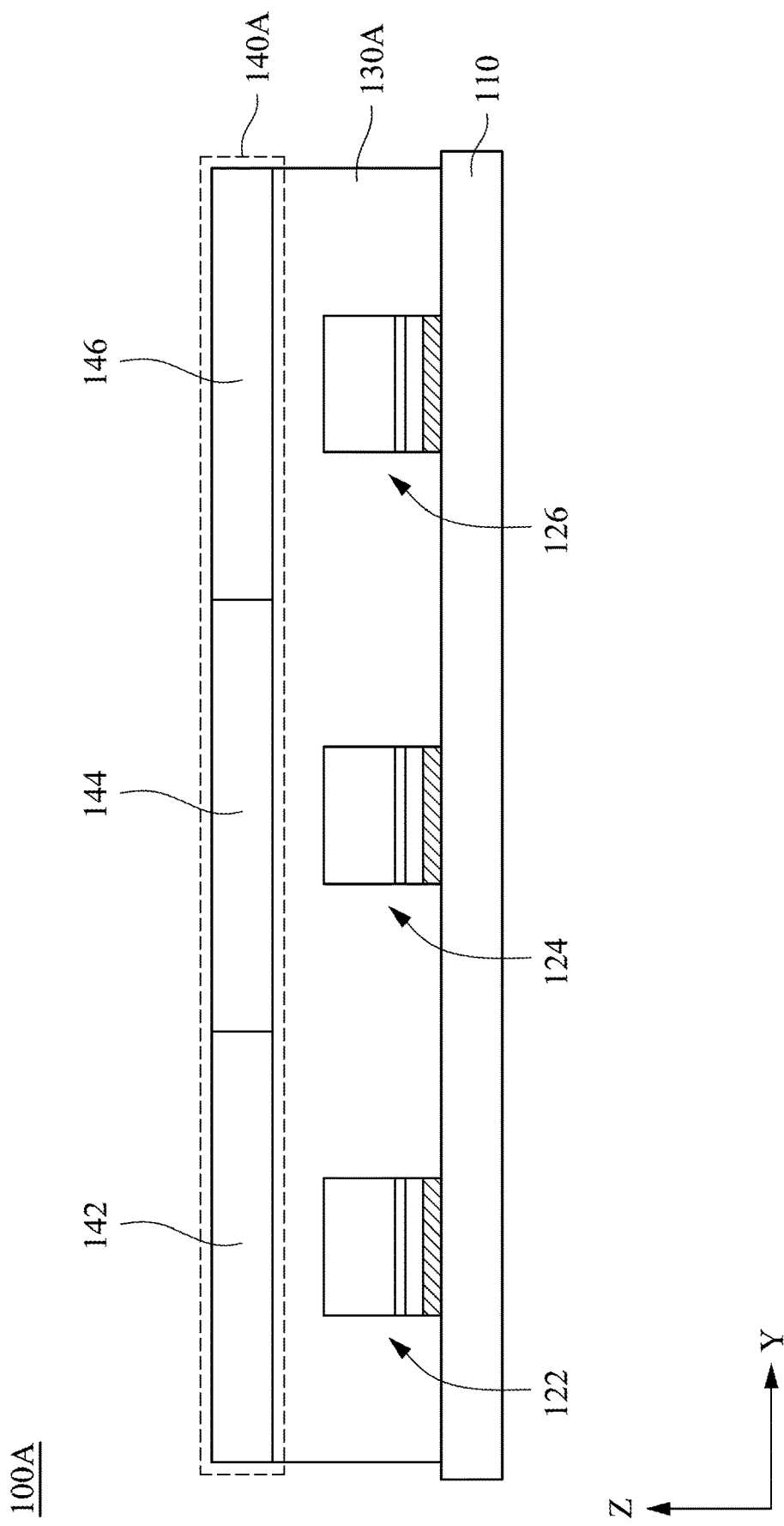
FIG. 1A is a cross-sectional view of a pixel encapsulating structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Although most of terms described in the following disclosure use singular nouns, said terms may also be plural in accordance with figures or practical applications.

Figure 1B:
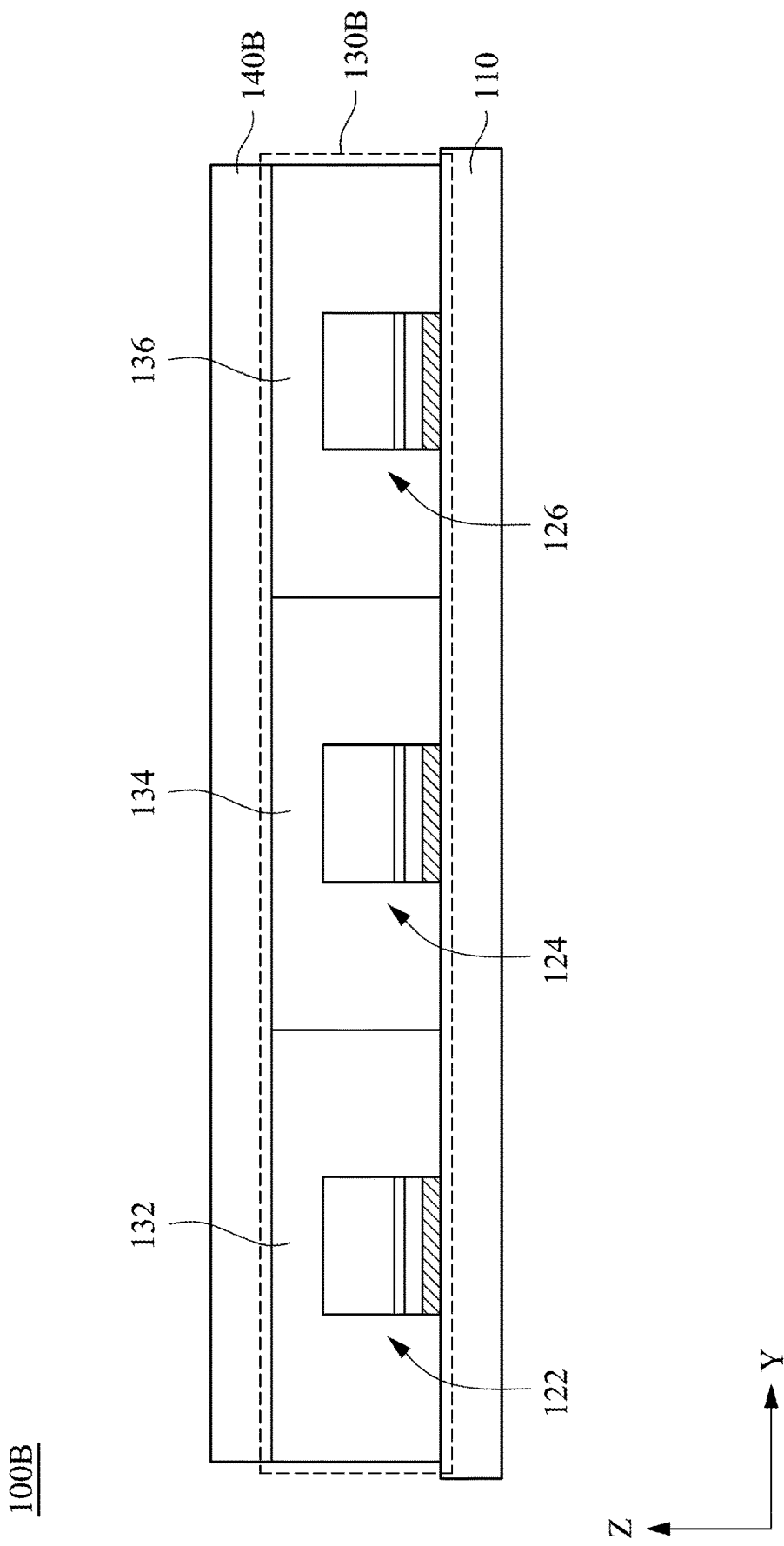
FIG. 1B is a cross-sectional view of a pixel encapsulating structure according to some embodiments of the present disclosure.

References are made to FIGS. 1A and 1B. FIG. 1A is a cross-sectional view of a pixel encapsulating structure 100A according to some embodiments of the present disclosure. FIG. 1B is a cross-sectional view of a pixel encapsulating structure 100B according to some embodiments of the present disclosure. In some embodiments, a pixel encapsulating structure 100A including a substrate 110, three light-emitting devices 122, 124, and 126, a filling material 130A, and a first encapsulation layer 140A is provided. The three light-emitting devices 122, 124, and 126 are present on the substrate 110. Two of the three light-emitting devices 122, 124, and 126 have different emission wavelengths. In some embodiments, the three light-emitting devices 122, 124, and 126 are a first light-emitting device 122, a second light-emitting device 124, and a third light-emitting device 126, respectively. It should be noted that there may be more than said three light-emitting devices 122, 124, and 126 present on the substrate 110, and these cases will not be described herein in detail since they are only an extension of applications of embodiments in the present disclosure. The filling material 130A is present on the substrate 110 and the three light-emitting devices 122, 124, and 126. In general, the filling material 130A includes a dielectric material, a photoresist, or a combination thereof. The first encapsulation layer 140A is present on the filling material 130A. In general, the first encapsulation layer 140A includes a dielectric material, a photoresist, or a combination thereof. The first encapsulation layer 140A covers the three light-emitting devices 122, 124, and 126 from a direction perpendicular to an extension of the substrate 110. Specifically, the substrate 110 is extended in a direction Y as shown in all of the figures in the present disclosure, and the first encapsulation layer 140A covers the three light-emitting devices 122, 124, and 126 from a direction Z as shown in all of the figures in the present disclosure. Generally, the direction Y is perpendicular to the direction Z. One of the first encapsulation layer 140A (as referred to FIG. 1A) and the filling material 130B (as referred to FIG. 1B) has three portions respectively covering the three light-emitting devices 122, 124, and 126. Two of the three portions have different refractive indices.

In some embodiments as illustrated in FIG. 1A, the first encapsulation layer 140A has three portions. The three portions are a first portion 142, a second portion 144, and a third portion 146, respectively. In some embodiments, the first portion 142, the second portion 144, and the third portion 146 are respectively used to refract light emitted from the first light-emitting device 122, light emitted from the second light-emitting device 124, and light emitted from the third light-emitting device 126. Specifically, the first portion 142, the second portion 144, and the third portion 146 are used to correct a color shift when viewed from an off angle with respect to a normal direction (i.e. off angle with respect to the direction Z) of the pixel encapsulating structure 100A. In some embodiments, a vertical projection of the first portion 142 on the substrate 110 is at least partially overlapped with a vertical projection of the first light-emitting device 122 on the substrate 110. In some embodiments, a vertical projection of the second portion 144 on the substrate 110 is at least partially overlapped with a vertical projection of the second light-emitting device 124 on the substrate 110. In some embodiments, a vertical projection of the third portion 146 on the substrate 110 is at least partially overlapped with a vertical projection of the third light-emitting device 126 on the substrate 110. In some embodiments, the refractive index of the first portion 142 is greater than the refractive index of the third portion 146, and the emission wavelength of the first light-emitting device 122 is greater than the emission wavelength of the third light-emitting device 126. For example, the first light-emitting device 122 can be a light-emitting diode which is configured to emit a red light, and the third light-emitting device 126 can be a light-emitting diode which is configured to emit a blue light. The colors mentioned above are just exemplifications and shall not be regarded as a limitation to the present disclosure. Due to the Snell's law, the dispersion relation, and the above configuration, the correction of the color shift can be realized, so that a wavelength distribution of light received when viewed from the off angle with respect to the direction Z can be more close to a wavelength distribution of light received when viewed from a direction parallel to the direction Z. To put it briefly, the shorter the wavelength of the light, the lower the refractive index for the high refractive index medium is used to refract the light.

In some embodiments, the first portion 142, the second portion 144, and the third portion 146 have different refractive indices. In some embodiments, the refractive index of the first portion 142 is greater than the refractive index of the second portion 144, the refractive index of the second portion 144 is greater than the refractive index of the third portion 146, the emission wavelength of the first light-emitting device 122 is greater than the emission wavelength of the second light-emitting device 124, and the emission wavelength of the second light-emitting device 124 is greater than the emission wavelength of the third light-emitting device 126. For example, the first light-emitting device 122 can be a light-emitting diode which is configured to emit the red light, the second light-emitting device 124 can be a light-emitting diode which is configured to emit a green light, and the third light-emitting device 126 can be a light-emitting diode which is configured to emit the blue light. A benefit of the above configuration is similar to the benefit of the correction of the color shift which has been described before and will not be repeated again herein. The colors mentioned above are just exemplifications and shall not be regarded as a limitation to the present disclosure. In some embodiments, the refractive indices of the first portion 142, the second portion 144, and the third portion 146 are defined under a wavelength selected from a range from about 400 nm to about 700 nm. In some embodiments, the refractive indices of the first portion 142, the second portion 144, and the third portion 146 are defined under a wavelength of about 550 nm.

In some embodiments as illustrated in FIG. 1B, the filling material 130B has three portions. The three portions are a first portion 132, a second portion 134, and a third portion 136, respectively. In these embodiments, the first encapsulation layer 140B may have a single refractive index. In some embodiments, the first portion 132, the second portion 134, and the third portion 136 are respectively used to refract the light emitted from the first light-emitting device 122, the light emitted from the second light-emitting device 124, and the light emitted from the third light-emitting device 126. In some embodiments, the first portion 132 covers and surrounds the first light-emitting device 122. In some embodiments, the second portion 134 covers and surrounds the second light-emitting device 124. In some embodiments, the third portion 136 covers and surrounds the third light-emitting device 126. In some embodiments, the refractive index of the first portion 132 is greater than the refractive index of the third portion 136, and the emission wavelength of the first light-emitting device 122 is greater than the emission wavelength of the third light-emitting device 126. For example, the first light-emitting device 122 can be a light-emitting diode which is configured to emit the red light, and the third light-emitting device 126 can be a light-emitting diode which is configured to emit the blue light. A benefit of the above configuration is similar to the benefit of the correction of the color shift which has been described before and will not be repeated again herein. The colors mentioned above are just exemplifications and shall not be regarded as a limitation to the present disclosure.

In some embodiments, the first portion 132, the second portion 134, and the third portion 136 have different refractive indices. In some embodiments, the refractive index of the first portion 132 is greater than the refractive index of the second portion 134, the refractive index of the second portion 134 is greater than the refractive index of the third portion 136, the emission wavelength of the first light-emitting device 122 is greater than the emission wavelength of the second light-emitting device 124, and the emission wavelength of the second light-emitting device 124 is greater than the emission wavelength of the third light-emitting device 126. For example, the first light-emitting device 122 can be a light-emitting diode which is configured to emit the red light, the second light-emitting device 124 can be a light-emitting diode which is configured to emit the green light, and the third light-emitting device 126 can be a light-emitting diode which is configured to emit the blue light. A benefit of the above configuration is similar to the benefit of the correction of the color shift which has been described before and will not be repeated again herein. The colors mentioned above are just exemplifications and shall not be regarded as a limitation to the present disclosure. In some embodiments, the refractive indices of the first portion 132, the second portion 134, and the third portion 136 are defined under the wavelength selected from a range from about 400 nm to about 700 nm. In some embodiments, the refractive indices of the first portion 132, the second portion 134, and the third portion 136 are defined under the wavelength of about 550 nm.

Figure 2A:
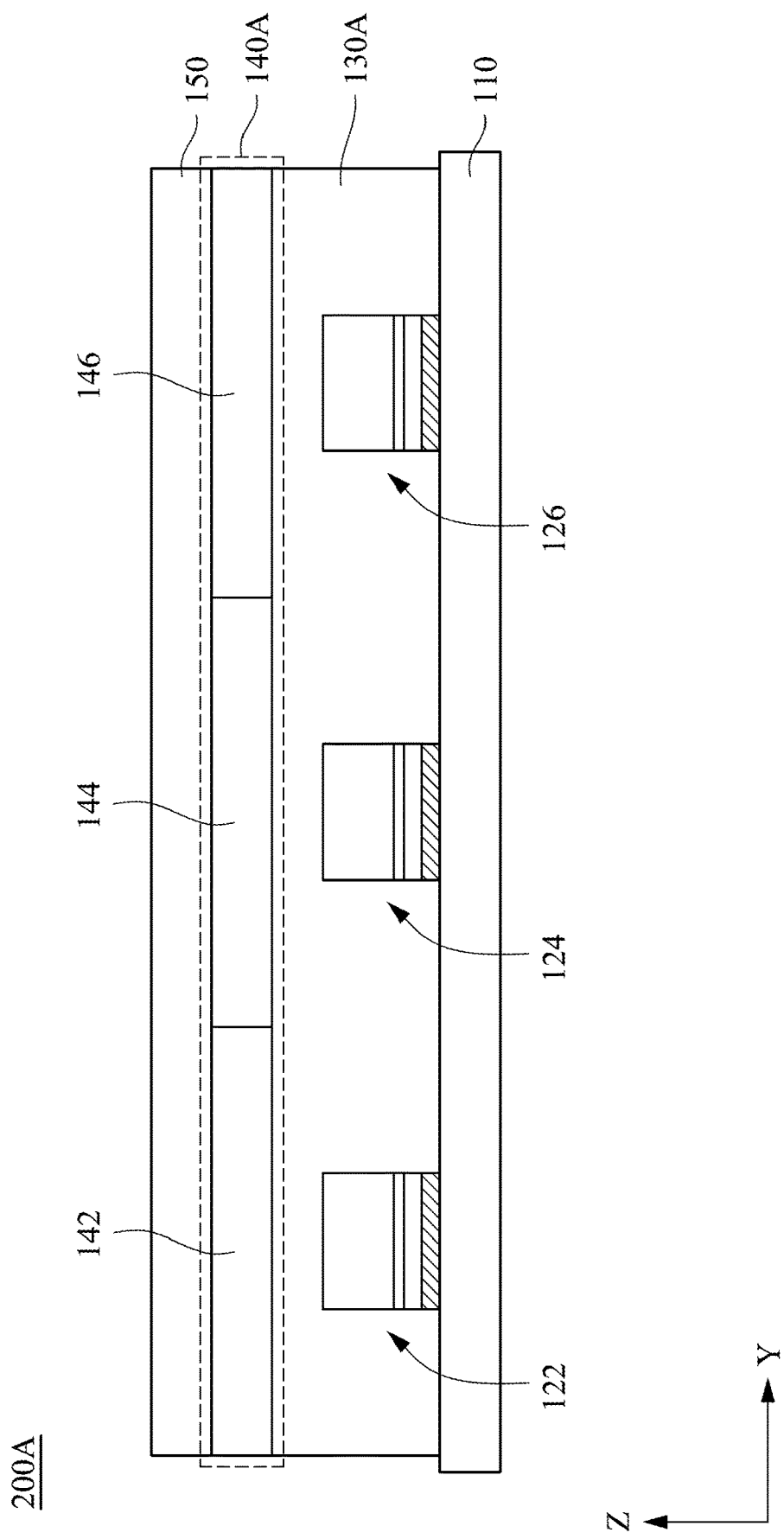
FIG. 2A is a cross-sectional view of a pixel encapsulating structure according to some embodiments of the present disclosure.
Figure 2B:
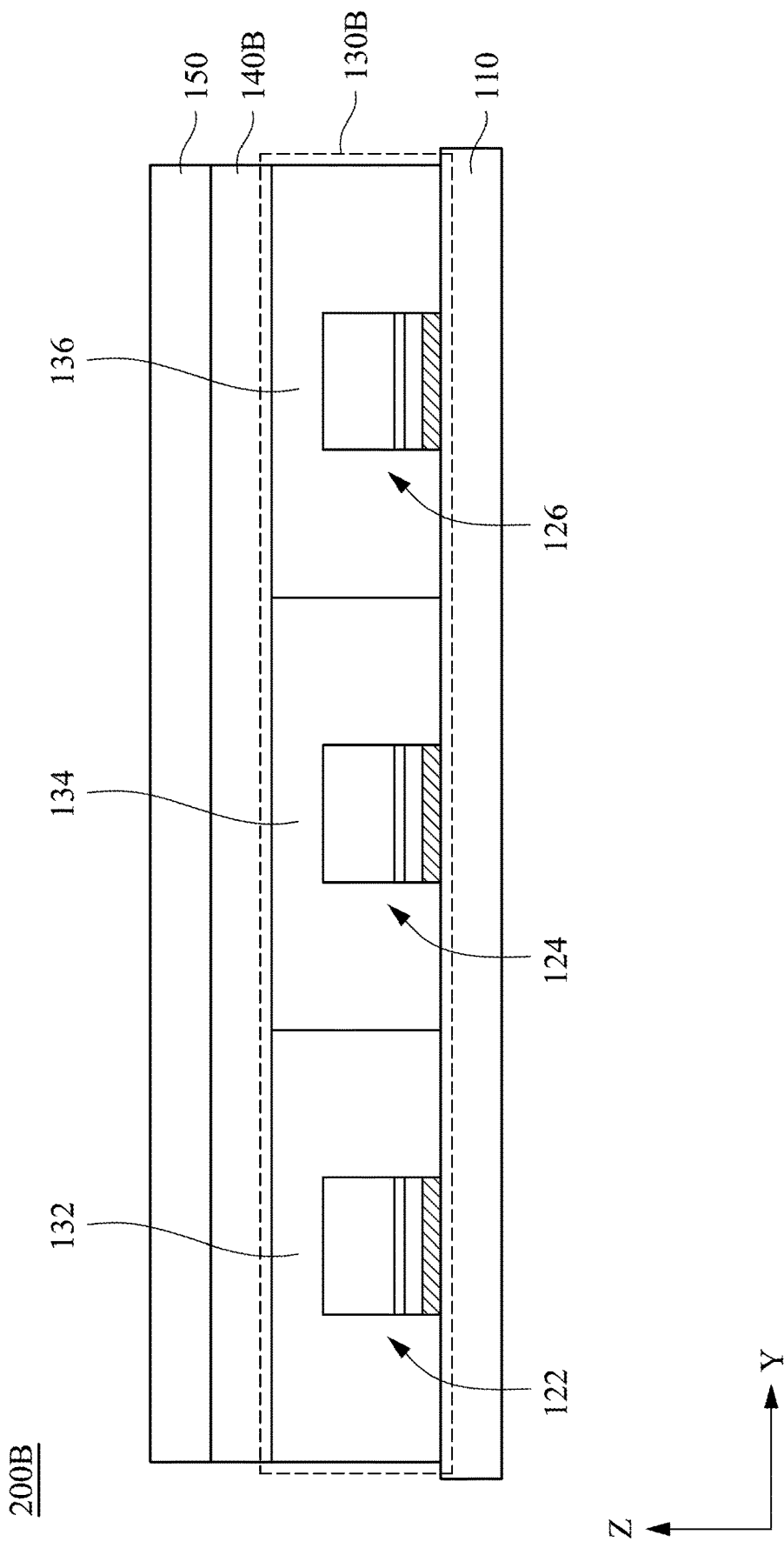
FIG. 2B is a cross-sectional view of a pixel encapsulating structure according to some embodiments of the present disclosure.

Reference is made to FIGS. 2A and 2B. FIG. 2A is a cross-sectional view of a pixel encapsulating structure 200A according to some embodiments of the present disclosure. FIG. 2B is a cross-sectional view of a pixel encapsulating structure 200B according to some embodiments of the present disclosure. A difference between the embodiments illustrated in FIG. 1A and the embodiments illustrated in FIG. 2A is that the pixel encapsulating structure 200A of FIG. 2A further includes a second encapsulation layer 150 present on the first encapsulation layer 140A compared to the pixel encapsulating structure 100A of FIG. 1A. In general, the second encapsulation layer 150 includes a dielectric material, a photoresist, or a combination thereof. In some embodiments, the second encapsulation layer 150 has a single refractive index which is irrelevant to the refractive indices of the first encapsulation layer 140A, and the filling material 130A. In some embodiments as illustrated in FIG. 2A, different parts of the second encapsulation layer 150 present on the first portion 142, the second portion 144, and the third portion 146 have the same refractive index.

A difference between the embodiments illustrated in FIG. 1B and the embodiments illustrated in FIG. 2B is that the pixel encapsulating structure 200B of FIG. 2B further includes the second encapsulation layer 150 present on the first encapsulation layer 140B compared to the pixel encapsulating structure 100B of FIG. 1B. In some embodiments as illustrated in FIG. 2B, different parts of the second encapsulation layer 150 present above the first portion 132, the second portion 134, and the third portion 136 have the same refractive index. The "above" described herein means "above in the direction Z".

Figure 3:
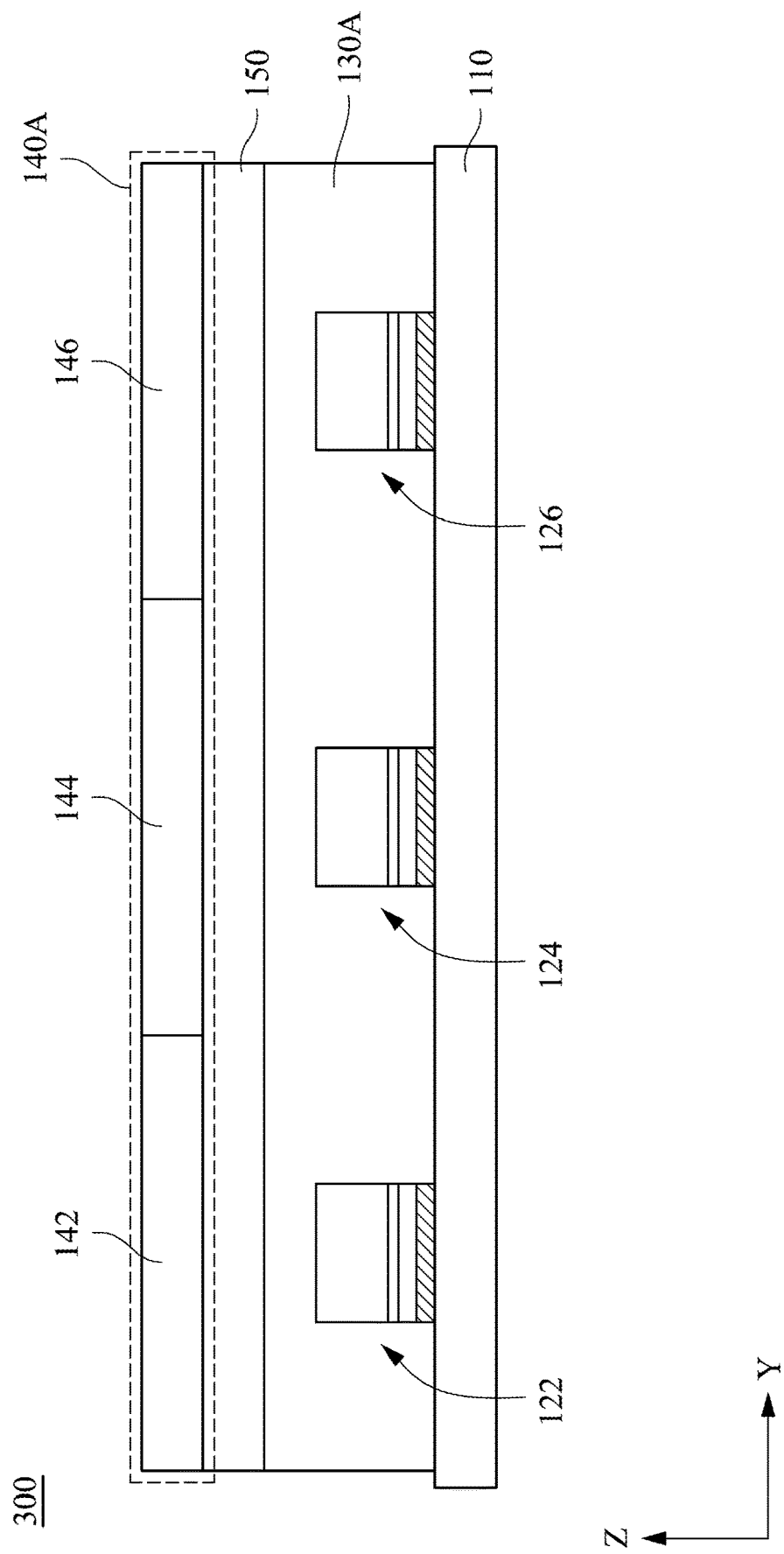
FIG. 3 is a cross-sectional view of a pixel encapsulating structure according to some embodiments of the present disclosure.

Reference is made to FIG. 3. FIG. 3 is a cross-sectional view of a pixel encapsulating structure 300 according to some embodiments of the present disclosure. A difference between the embodiments illustrated in FIG. 1A and the embodiments illustrated in FIG. 3 is that the pixel encapsulating structure 300 of FIG. 3 further includes the second encapsulation layer 150 present between the first encapsulation layer 140A and the filling material 130A compared to the pixel encapsulating structure 100A of FIG. 1A. Different parts of the second encapsulation layer 150 present below (in a negative z-direction) the first portion 142, the second portion 144, and the third portion 146 have the same refractive index.

Figure 4:
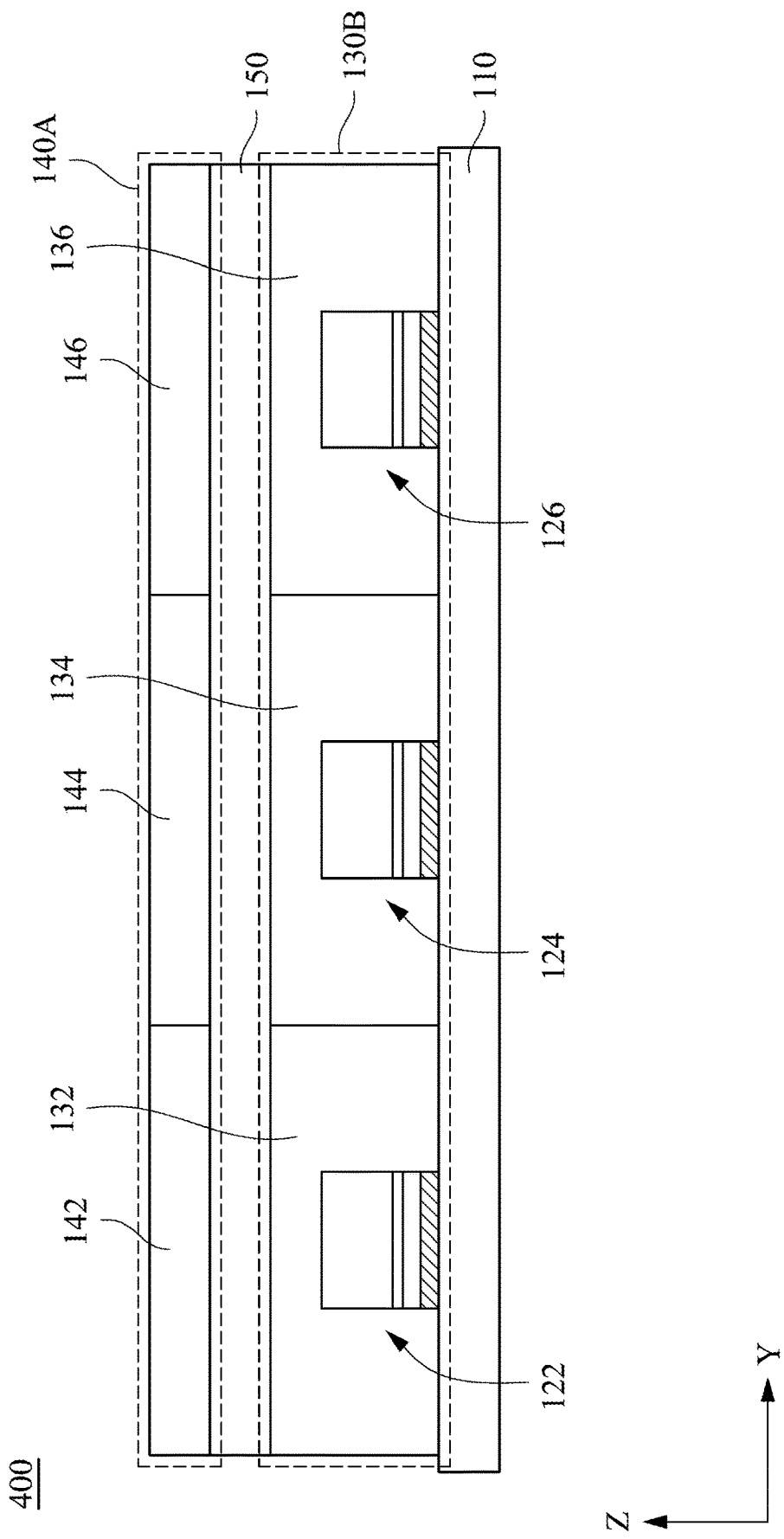
FIG. 4 is a cross-sectional view of a pixel encapsulating structure according to some embodiments of the present disclosure.

Reference is made to FIG. 4. FIG. 4 is a cross-sectional view of a pixel encapsulating structure 400 according to some embodiments of the present disclosure. A difference between the embodiments illustrated in FIG. 4 and the embodiments illustrated in FIG. 3 is that the first filling material 130B of the pixel encapsulating structure 400 illustrated in FIG. 4 has three portions. The three portions are a first portion 132, a second portion 134, and a third portion 136, respectively. Details of the first filling material 130B has been described in the embodiments illustrated in FIG. 1B and will not be repeated herein again.

In summary, embodiments of the present disclosure provide a pixel encapsulating structure in which at least one of a filling material and an encapsulation layer has a plurality of portions having different refractive indices to refract lights emitted from light-emitting devices with different wavelengths within one pixel, so as to correct a color shift phenomenon.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A pixel encapsulating structure, comprising:
   a substrate;
   three light-emitting devices present on the substrate, wherein two of the three light-emitting devices have different emission wavelengths;
   a filling material present on the substrate and the three light-emitting devices; and
   a first encapsulation layer present on the filling material and covering the three light-emitting devices,
   wherein one of the first encapsulation layer and the filling material has three portions respectively covering the three light-emitting devices, two of the three portions have different refractive indices, and the refractive indices of the three portions are defined under a wavelength selected from a range from about 400 nm to about 700 nm, and
   wherein the three light-emitting devices comprise a first light-emitting device, a second light-emitting device, and a third light-emitting device, the three portions comprise a first portion, a second portion, and a third portion, a vertical projection of the first portion on the substrate is at least partially overlapped with a vertical projection of the first light-emitting device on the substrate, a vertical projection of the second portion on the substrate is at least partially overlapped with a vertical projection of the second light-emitting device on the substrate, and a vertical projection of the third portion on the substrate is at least partially overlapped with a vertical projection of the third light-emitting device on the substrate.

2. The pixel encapsulating structure of claim 1, wherein the three light-emitting devices comprise a first light-emitting device, a second light-emitting device, and a third light-emitting device, the three portions comprise a first portion covering the first light-emitting device, a second portion covering the second light-emitting device, and a third portion covering the third light-emitting device, the refractive index of the first portion is greater than the refractive index of the third portion, and the emission wavelength of the first light-emitting device is greater than the emission wavelength of the third light-emitting device.

3. The pixel encapsulating structure of claim 1, further comprising:
   a second encapsulation layer present between the first encapsulation layer and the filling material.

4. The pixel encapsulating structure of claim 1, wherein the refractive indices of the three portions are defined under a wavelength of about 550 nm.

5. The pixel encapsulating structure of claim 1, further comprising:

a second encapsulation layer present on the first encapsulation layer.

6. The pixel encapsulating structure of claim 1, wherein the three portions have different refractive indices.

* * * * *